US012622062B2

(12) United States Patent
Cao et al.

(10) Patent No.: US 12,622,062 B2
(45) Date of Patent: May 5, 2026

(54) ARRAY SUBSTRATE, DISPLAY PANEL AND DISPLAY DEVICE

(71) Applicant: HKC CORPORATION LIMITED, Shenzhen (CN)

(72) Inventors: Zhonglin Cao, Shenzhen (CN); Tien-Chun Huang, Shenzhen (CN); Yao Li, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 373 days.

(21) Appl. No.: 18/343,037

(22) Filed: Jun. 28, 2023

(65) Prior Publication Data

US 2024/0313005 A1      Sep. 19, 2024

(30) Foreign Application Priority Data

Mar. 14, 2023      (CN) .......................... 202310279512.5

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/443* (2025.01)

(58) Field of Classification Search
CPC ...... H10D 86/60; H10D 86/443; H10D 86/40; G02F 1/13629; G02F 1/1362; G02F 1/1368
See application file for complete search history.

(56) References Cited

U.S. PATENT DOCUMENTS 8,878,815 B2 * 11/2014 Suzuki .............. G02F 1/136286
                                                                    345/173
9,318,040 B1 * 4/2016 Tsai .................. G02F 1/136286
(Continued)

FOREIGN PATENT DOCUMENTS

CN          101364019 A       2/2009
CN          103376605 A      10/2013
(Continued)

OTHER PUBLICATIONS

Search Report on Patentability issued on Dec. 13, 2023, in corresponding International Application No. PCT/CN2023/097487, 10 pages.

(Continued)

*Primary Examiner* — Nikolay K Yushin
(74) *Attorney, Agent, or Firm* — Maier & Maier, PLLC

(57) ABSTRACT

An array substrate, a display panel, and a display device are provided. The array substrate includes a display region and a peripheral region. The peripheral region includes a substrate, and a plurality of first signal lines arranged in a first direction, an insulation layer, and a plurality of second signal lines arranged in the second direction. Each first signal line includes a first sub segment and a second sub segment which are alternately connected in the second direction. An orthographic projection of the second signal line on the substrate respectively overlaps with an orthographic projection of the first sub segment on the substrate and an orthographic projection of the second sub segment on the substrate to form a first cross line region and a second cross line region, respectively. The first cross line region and the second cross line region are arranged alternately along the first direction.

14 Claims, 5 Drawing Sheets

(56) References Cited

U.S. PATENT DOCUMENTS

| | | | | |
|---|---|---|---|---|
| 12,310,196 B2 * | 5/2025 | Zhang | ................. | H10K 59/1315 |
| 2013/0278553 A1 * | 10/2013 | Suzuki | ................. | G02F 1/13338 |
| | | | | 345/174 |
| 2014/0028625 A1 | 1/2014 | Maeda et al. | | |
| 2016/0133173 A1 * | 5/2016 | Tsai | .................. | G02F 1/136286 |
| | | | | 345/694 |
| 2019/0041915 A1 | 2/2019 | Park et al. | | |
| 2024/0373690 A1 * | 11/2024 | Zhang | .................. | H10K 59/131 |
| 2025/0069529 A1 * | 2/2025 | Sun | ......................... | H10D 86/60 |

FOREIGN PATENT DOCUMENTS

| | | | |
|---|---|---|---|
| CN | 103677386 A | 3/2014 |
| CN | 105182646 A | 12/2015 |
| CN | 107634086 A | 1/2018 |
| CN | 107665059 A | 2/2018 |
| CN | 109036251 A | 12/2018 |
| CN | 208273033 U | 12/2018 |
| CN | 109390378 A | 2/2019 |
| CN | 110515249 A | 11/2019 |
| CN | 209571218 U | 11/2019 |
| CN | 114397787 A | 4/2022 |
| CN | 114815421 A | 7/2022 |
| CN | 114967248 A | 8/2022 |
| JP | H08213631 A | 8/1996 |
| JP | 2001356366 A | 12/2001 |

OTHER PUBLICATIONS

Office Action issued on Apr. 4, 2024, in corresponding Chinese Application No. 202310279512.5, 14 pages.

* cited by examiner

ARRAY SUBSTRATE, DISPLAY PANEL AND DISPLAY DEVICE

CROSS-REFERENCE TO RELATED APPLICATION

Pursuant to 35 U.S.C. § 119 and the Paris Conversion, this application claims priority to Chinese Patent Application No. 202310279512.5 filed on Mar. 14, 2023, the entire contents of which are incorporated herein by reference.

TECHNICAL FIELD

The present application relates to the technical field of displaying technologies, and more particularly to an array substrate, a display panel and a display device.

BACKGROUND

The statements provided herein are merely background information related to the present application, and do not necessarily constitute any prior arts. With the development of liquid crystal display technology and the trend of narrow bezel in liquid crystal display panel, gate driver on array (GOA) technology is widely used in the array substrate of the liquid crystal display panel. GOA usually includes a plurality of first signal lines and a plurality of second signal lines located in different layers. In the thickness direction of the array substrate, the first signal lines and the second signal lines overlap (cross line) with each other, such that capacitances are formed at the overlapping positions, the load of the signal lines are increased and a signal delay is caused.

Generally, a line width thinning processing is performed on the first signal line at the cross line position. However, for a flexible display panel, current densities at the positions where the first signal lines become thinner are increased during the operation of the flexible display panel. When a crack appears in an insulation layer between the first line and the second signal line, short circuit between the first signal line and the second signal line is prone to occur, and the positions where the first signal lines become thinner are arranged to be adjacent in the same direction. The first signal lines are prone to be fractured at the thinning positions when the flexible display panel is bent, signal loss is caused and display effect is poor.

SUMMARY

An array substrate, a display panel, and a display device are provided in the embodiments of the present application. By segmenting each first signal line as first sub segment and second sub segment that are alternatively connected, a width of the first sub segment is smaller than a width of the second sub segment, and first cross line regions and second cross line regions formed by the arrangement of the first signal lines and the second signal lines are alternately arranged in the first direction. Due to this arrangement, a problem that signal lines in different layers of the existing flexible display panel are prone to have a short circuit at the cross line positions, and are prone to be fractured when the flexible display panel is bent has been solved.

The present invention is implemented in this way: an array substrate, including a display region and a peripheral region located around the display region; the peripheral region includes a substrate, a plurality of first signal lines arranged on the substrate, an insulation layer arranged on the substrate and covering the plurality of first signal lines, and a plurality of second signal lines arranged on the insulation layer. The plurality of first signal lines are arranged in a first direction, the plurality of second signal lines are arranged in a second direction, and the first direction is perpendicular to the second direction. Each first signal line includes a first sub segment and a second sub segment which are alternately connected along the second direction, and a size of the first sub segment is smaller than a size of the second sub segment in the first direction. An orthographic projection of the second signal line on the substrate overlaps with an orthographic projection of the first sub segment on the substrate to form a first cross line region, and an orthographic projection of the second signal line on the substrate overlaps with an orthographic projection of the second sub segment on the substrate to form a second cross line region. The first cross line region and the second cross line region are alternately arranged along the first direction.

In one embodiment, the size of the first sub segment is the same as that of the second sub segment along the second direction.

In one embodiment, the first cross line region is located in a middle of the first sub segment, and the second cross line region is located in a middle of the second sub segment, along the second direction.

In one embodiment, a first hollow hole is arranged on the second sub segment, and an orthogonal projection of the first hollow hole on the substrate overlaps with an orthogonal projection of the second signal line on the substrate.

In one embodiment, a size of the first hollow hole is less than or equal to half of the size of the second sub segment along the first direction.

In one embodiment, an edge of the orthographic projection of the first hollow hole on the substrate is spaced apart from an edge of the orthographic projection of the second sub segment on the substrate.

In one embodiment, the first signal line is in a strip shape.

One first hollow hole is arranged on the second sub segment, and the first hollow hole is a square hole or a circular hole.

In one embodiment, a plurality of first hollow holes are arranged on the second sub segment, and the plurality of first hollow holes are arranged to be spaced apart along the first direction. The first hollow holes are square holes.

In one embodiment, a second hollow hole is arranged on the first sub segment, and an orthogonal projection of the second hollow hole on the substrate overlaps with the orthogonal projection of the second signal line on the substrate.

In one embodiment, a size of the second hollow hole is less than or equal to half of the size of the first sub segment along the first direction.

In one embodiment, the second hollow hole and the first hollow hole arranged on each of the plurality of first signal lines are spaced apart from each other.

The array substrate in accordance with the present application has the following beneficial effects: as compared to the prior art, each first signal line in the present application is arranged to include alternately arranged first sub segments and second sub segments, and the size of each first sub segment in the first direction is smaller than the size of each second sub segment in the first direction. Furthermore, the first cross line regions which are formed by the overlapping of the orthographic projections of the second signal lines and the first sub segments on the substrate and the second cross line regions which are formed by the overlapping of the orthographic projections of the second signal lines and the second sub segments on the substrate are alternately arranged in the first direction. Due to this arrangement, the current densities can be evenly distributed in the first cross line regions and the second cross line regions, rather than being all concentrated in smaller cross line regions, which is conducive to reducing the risk of short circuit between the first signal lines and the second signal lines. Moreover, when the first signal lines are bent with the bending of the flexible display panel, fracture of the first signal lines can be effectively avoided due to the uniform distribution of the overall line widths and stress dispersion of the first signal lines.

A display panel is further provided in the embodiments of the present application. The display panel includes a first substrate and the array substrate according to any one of the embodiments. The array substrate is arranged to be opposite to the first substrate. Both the first substrate and the array substrate are flexible substrates.

The display panel in accordance with the present application has the following beneficial effects: the aforesaid array substrate is applied in the display panel. Each first signal line in the present application is arranged to include alternately arranged first sub segments and second sub segments, and the size of each first sub segment in the first direction is smaller than the size of each second sub segment in the first direction. Furthermore, the first cross line regions which are formed by the overlapping of the orthographic projections of the second signal lines and the first sub segments on the substrate and the second cross line regions which are formed by the overlapping of the orthographic projections of the second signal lines and the second sub segments on the substrate are alternately arranged in the first direction. Due to this arrangement, the current densities can be evenly distributed in the first cross line regions and the second cross line regions, rather than being all concentrated in smaller cross line regions, which is conducive to reducing the risk of short circuit between the first signal lines and the second signal lines. Moreover, when the first signal lines are bent with the bending of the flexible display panel, fracture of the first signal lines can also be effectively avoided due to the uniform distribution of the overall line widths and stress dispersion of the first signal lines.

A display device is further provided in the present application. The display device includes a drive module and the display panel according to the aforesaid embodiment. The drive module is electrically connected to the display panel.

The display device in accordance with the present application has the following beneficial effects: the aforesaid display panel is applied in the display device. Each first signal line in the present application is arranged to include alternately arranged first sub segments and second sub segments, and the size of each first sub segment in the first direction is smaller than the size of each second sub segment in the first direction. Furthermore, the first cross line regions which are formed by the overlapping of the orthographic projections of the second signal lines and the first sub segments on the substrate and the second cross line regions which are formed by the overlapping of the orthographic projections of the second signal lines and the second sub segments on the substrate are alternately arranged in the first direction. Due to this arrangement, the current densities can be evenly distributed in the first cross line regions and the second cross line regions, rather than being all concentrated in smaller cross line regions, which is conducive to reducing the risk of short circuit between the first signal lines and the second signal lines. Moreover, when the first signal lines are bent with the bending of the flexible display panel, fracture of the first signal lines can also be effectively avoided due to the uniform distribution of the overall line widths and stress dispersion of the first signal lines.

DETAILED DESCRIPTION OF EMBODIMENTS

Figure 1:
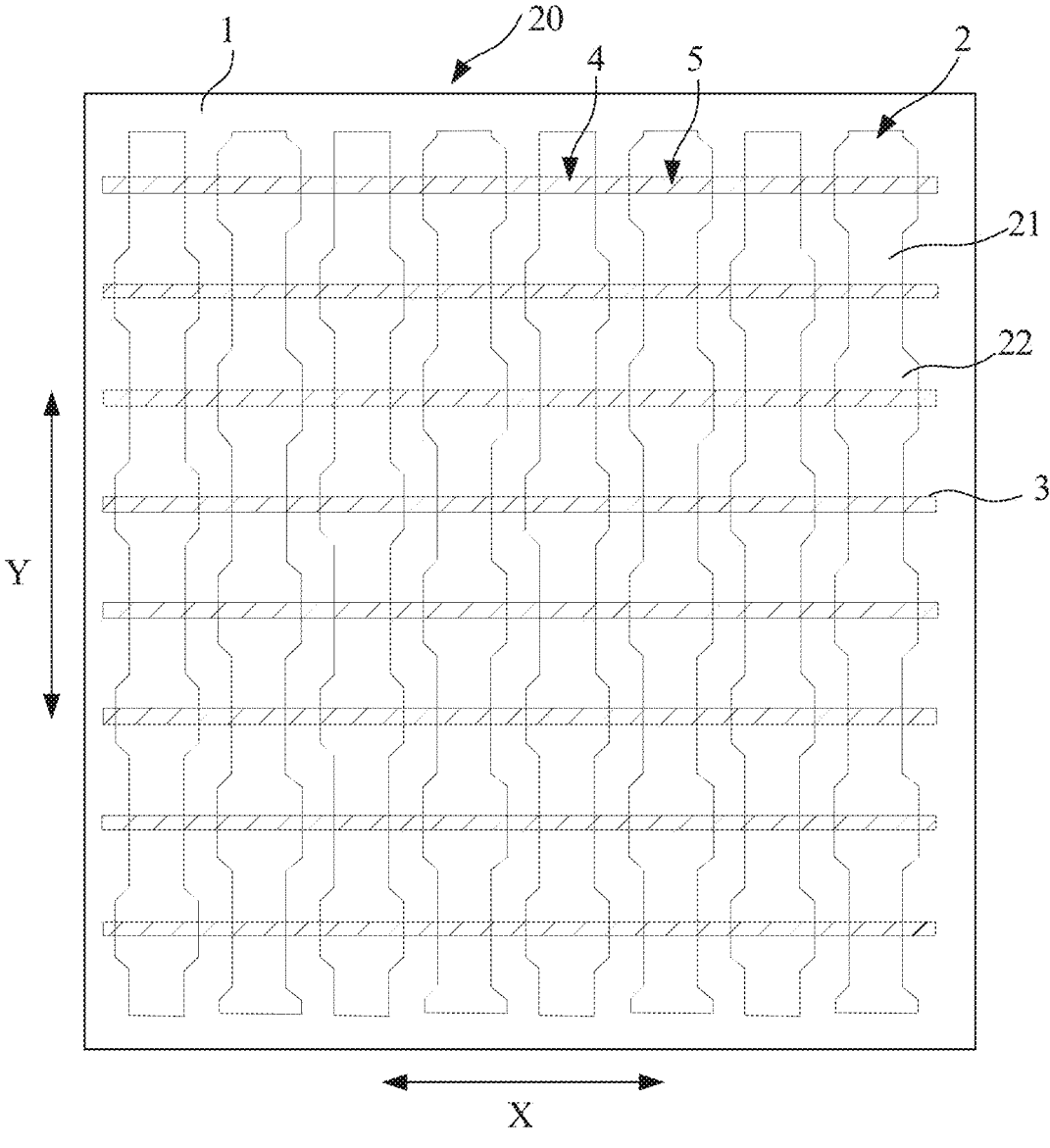
FIG. 1 illustrates a schematic structural diagram of an array substrate in accordance with the first embodiment of the present application.

In order to make the objective, the technical solutions and the advantages of the present application be clearer and more understandable, the present application will be further described in detail below with reference to accompanying figures and embodiments. It should be understood that the embodiments described in detail herein are merely intended to illustrate but not to limit the present application.

It needs to be noted that, when describing that one component is "fixed to" or "arranged on" another component, this component can be directly or indirectly arranged on another component. When describing that one component "is connected with" another component, this component can be directly or indirectly connected to another component.

It needs to be understood that, directions or location relationships represented by terms such as "length", "width", "up", "down", "front", "rear", "left", "right", "vertical", "horizontal", "top", "bottom", "inside", "outside", etc., are the directions or location relationships shown in the accompanying figures, and are only intended to describe the present application conveniently and for the purpose of conciseness of the description of the present application, but should not be interpreted as indicating or implying that a device or a component indicated by the terms must have specific locations and be constructed and manipulated according to the specific locations. Thus, these terms shouldn't be considered as limitation to the present application.

In addition, terms such as "the first" and "the second" are only for the purpose of illustration, rather than being interpreted as indicating or implying any relative importance, or implicitly indicating the number of indicated technical features. Thus, technical feature(s) restricted by "the first" or "the second" can explicitly or implicitly comprise one or more such technical feature(s). In the description of the present application, the term "a plurality of" indicates a number of at least two, unless otherwise the term "a plurality of" is explicitly and In particular defined.

It should also be noted that, in the embodiments of the present application, one reference numeral is used to represent the same part or the same component. For the same component in the embodiments of the present application, one reference numeral can be used as an example to represent only one part or component. It should be understood that, the reference numeral also applies to other parts or components which are identical to the part/component represented by the reference numeral.

An array substrate, a display panel, and a display device are provided in the embodiments of the present application, which have solved the problems that signal lines in different layers of an existing flexible display panel are prone to have a short circuit at cross line positions and are prone to be fractured when the flexible display panel is bent.

At present, the gate driver on array (GOA) of an array substrate usually includes a plurality of signal lines located in different layers. In a direction perpendicular to the array substrate, an occurrence of overlapping (at cross line positions) of signal lines located in different layers is inevitable. Usually, signal lines from different layers are connected through vias to perform signal transmission. Generally, bus signal transmission is performed using signal lines in the layer adjacent to a substrate 1, and branch signal transmission is performed using a signal line of another layer. The signal line used for bus signal transmission is wider, and the signal line used for branch signal transmission is narrower. Cross line and overlapping occur between the two layers of signal lines, a capacitance can be formed and the load of the two layers of signal lines is increased, and a signal delay is caused. Therefore, in design, line width refinement processing is usually performed on the wider signal line at the cross line position to reduce the load.

However, this arrangement may cause following problems: first problem is that the current density of the wider signal line increases at the thinner position, and the electric field at this thinner position increases. When the array substrate is an array substrate in a flexible display panel, due to the bending of the flexible display panel, an insulation layer 11 between different layers of signal lines may have slight fracture under long-time bending state. Since signal lines are generally made of metal, thus, accelerated diffusion of metal Cu at the thinner position of the wider signal line is prone to occur, the signal lines in different layers have short circuit, and poor signal transmission is caused; the second problem is that when the flexible display panel is folded and bent, due to the fact that the cross line and overlapping positions of the signal lines in different layers are all located at the positions where the wider signal lines become thinner; thus, the signal lines are prone to be fractured completely to cause signal loss and poor display effect, due to the stress during bending of the flexible display panel.

Gate driver on array (GOA), that is, an integrated gate driver circuit, is the technology that utilizes an array manufacturing process of the existing TFT-LCD (Thin Film Transistor Liquid Crystal Display) to fabricate gate driver circuit on the array substrate to achieve a progressive scanning of the gate electrode.

The technical solutions of the present application and the technical solutions on how to solve the aforesaid technical problems are described in detail with reference to the embodiments below. It should be noted that the following implementation methods can be mutually referenced, learned from each other, or combined. The same terms, similar features, and similar implementation steps in different implementation methods are not repeatedly described herein.

First Embodiment

Figure 5:
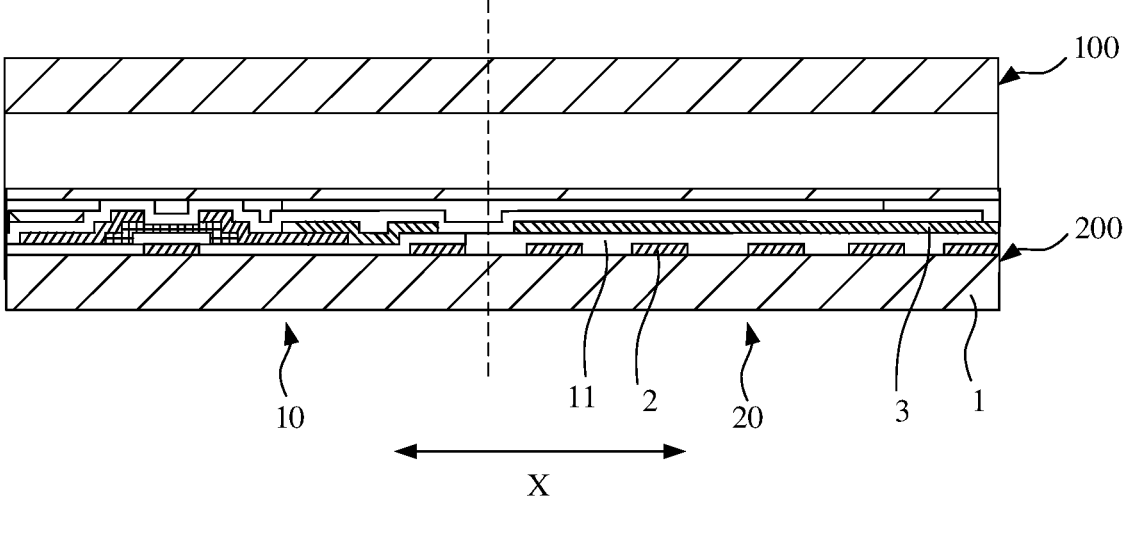
FIG. 5 illustrates a schematic structural diagram of a display panel in accordance with the fifth embodiment of the present application.

Referring to FIGS. 1 and 5, the array substrate provided in the first embodiment of the present application includes a display region 10 and a peripheral region 20 located around the display region 10. Signal lines are arranged in the peripheral region 20. The peripheral region 20 includes a substrate 1, a plurality of first signal lines 2 arranged on the substrate 1, an insulation layer 11 arranged on the substrate 1 and covering the first signal lines 2, and a plurality of second signal lines 3 arranged on the insulation layer 11.

The plurality of first signal lines 2 are arranged in a first direction X, and a plurality of second signal lines 3 are arranged in a second direction Y, the first direction X and the second direction Y are perpendicular to each other. Due to this arrangement, cross lines and overlapping occur between the first signal lines 2 and the second signal lines 3 in the thickness direction of the substrate 1. Usually, the first signal lines 2 are used for transmitting bus signals, the second signal lines 3 are connected to the first signal line 2 through via holes and are used for transmitting branch signals. Therefore, widths of the first signal lines 2 are larger than that of the second signal lines 3.

It should be noted that, the positions of the first signal lines 2 and the second signal lines 3 on the substrate 1 in the first embodiment of the present application is only a commonly used method by the person of ordinary skill in the art. The first embodiment of the present application is illustrative and thus is not limited to other arrangement methods, such as exchanging the positions of the first signal lines 2 and the second signal lines 3.

It should be noted that the first signal lines 2 and the second signal lines 3 are all made of metal. In particular, a metal layer can be coated on the substrate 1, and the metal layer can be etched through a mask to form a plurality of first signal lines 2 arranged in the first direction X. Then, the first signal lines 2 are covered with an insulation layer 11, and the insulation layer 11 is coated with a metal layer. Then, the metal layer is etched through a mask to form a plurality of second signal lines 3 arranged in the second direction Y. In this way, the plurality of first signal lines 2 and the plurality of second signal lines 3 can be produced simultaneously in one time. Not only a production efficiency is much higher, but also the conductivity between the first signal lines 2 and the second signal lines 3 is much better.

Referring to FIG. 1, each first signal line 2 includes alternately connected first segments 21 and second sub segments 22 along the second direction Y. A size of the first sub segment 21 is smaller than that of the second sub segment 22 along the first direction X. An orthogonal projection of the second signal line 3 on the substrate 1 overlaps with an orthogonal projection of the first sub segment 21 on the substrate 1 to form one first cross line region 4, and the orthogonal projection of the second signal line 3 on the substrate 1 overlaps with an orthogonal projection of the second sub segment 22 on the substrate 1 to form one second cross line region 5. The first cross line region 4 and the second cross line region 5 are alternately arranged along the first direction X.

Both the first signal line 2 and the second signal line 3 have a slender structure. The first direction X is the width direction of the first signal line 2, and the second direction Y is the length direction of the first signal line 2. Thus, the size of the first signal line 2 in the first direction X is the width of the first signal line 2. Similarly, the size of the first sub segment 21 in the first direction X is the width of the first sub segment 21, the size of the second sub segment 22 in the first direction X is the width of the second sub segment 22.

According to this arrangement, the wider parts and the thinner parts on the first signal line 2 are alternately arranged, not all cross line overlapping regions of the first signal lines 2 and the second signal lines 3 are located on the thinner parts of the first signal lines 2. This arrangement can make the current densities in the cross line regions to be more evenly distributed on the first signal lines 2. A rapid diffusion of metal copper in the first signal lines 2 and second signal lines 3 at a position where current density is increased due to the increase of the current density at this position will not occur. An occurrence of short circuit in the first signal lines 2 and second signal lines 3 due to the fracture of the insulation layer 11 can be effectively avoided, and the normal signal transmission function of the first signal lines 2 and second signal lines 3 would not be influenced. In addition, when the flexible display panel is bent and the first signal line 2 is bent in the second direction Y with the bending of the flexible display panel, since the thicker parts and the thinner parts of the first signal line 2 are arranged in the first direction X, such that the stress caused by bending can be more dispersed, it is harder to break the first signal lines 2, the bending performance of the flexible display panel is further enhanced.

In some embodiments, the size of the first sub segment 21 is the same as that of the second sub segment 22 along the second direction Y. In this way, the wider parts and the thinner parts of the first signal line 2 are evenly distributed, which facilitates stress dispersion when the first signal line 2 is bent. Moreover, the cross line overlapping positions of the second signal line 3 and the first signal line 2 can be evenly distributed on the first signal line 2, such that the current cannot be crowded at the cross line positions to cause excessive current density, short circuit between the first signal line 2 and the second signal line 3 can be effectively avoided.

The size of the first sub segment 21 along the second direction Y is the length of the first sub segment 21, and the size of the second sub segment 22 along the second direction Y is the length of the second sub segment 22.

It should be noted that, both the first signal line 2 and the second signal line 3 are shaped as flat strips, the first sub segment 21 is a thinner part and the second sub segment 22 a wider part. During manufacturing, a centerline of the first sub segment 21 in the second direction Y can coincide with a centerline of the second sub segment 22 in the second direction Y, and the connection between the second sub segment 22 and the first sub segment 21 can be an oblique angle for transition. This arrangement facilitates uniform distribution of current densities on the first signal line 2 and facilitates uniform stress dispersion, the first signal line 2 is not prone to be fractured.

In some embodiments, in the second direction Y, the first cross line region 4 is located in the middle of the first sub segment 21, and the second cross line region 5 is located in the middle of the second sub segment 22. Due to this arrangement, the spacing distances between every two of the plurality of second signal lines 3 arranged in the second direction Y are equal, which is conducive to a matrix distribution of the cross line overlapping positions of the second signal lines 3 and the first signal lines 2. Uniform stress dispersion on the first signal line 2 and the second signal line 3 is facilitated when the flexible display panel is bent, and the first signal lines 2 cannot be fractured.

Second Embodiment

Figure 2:
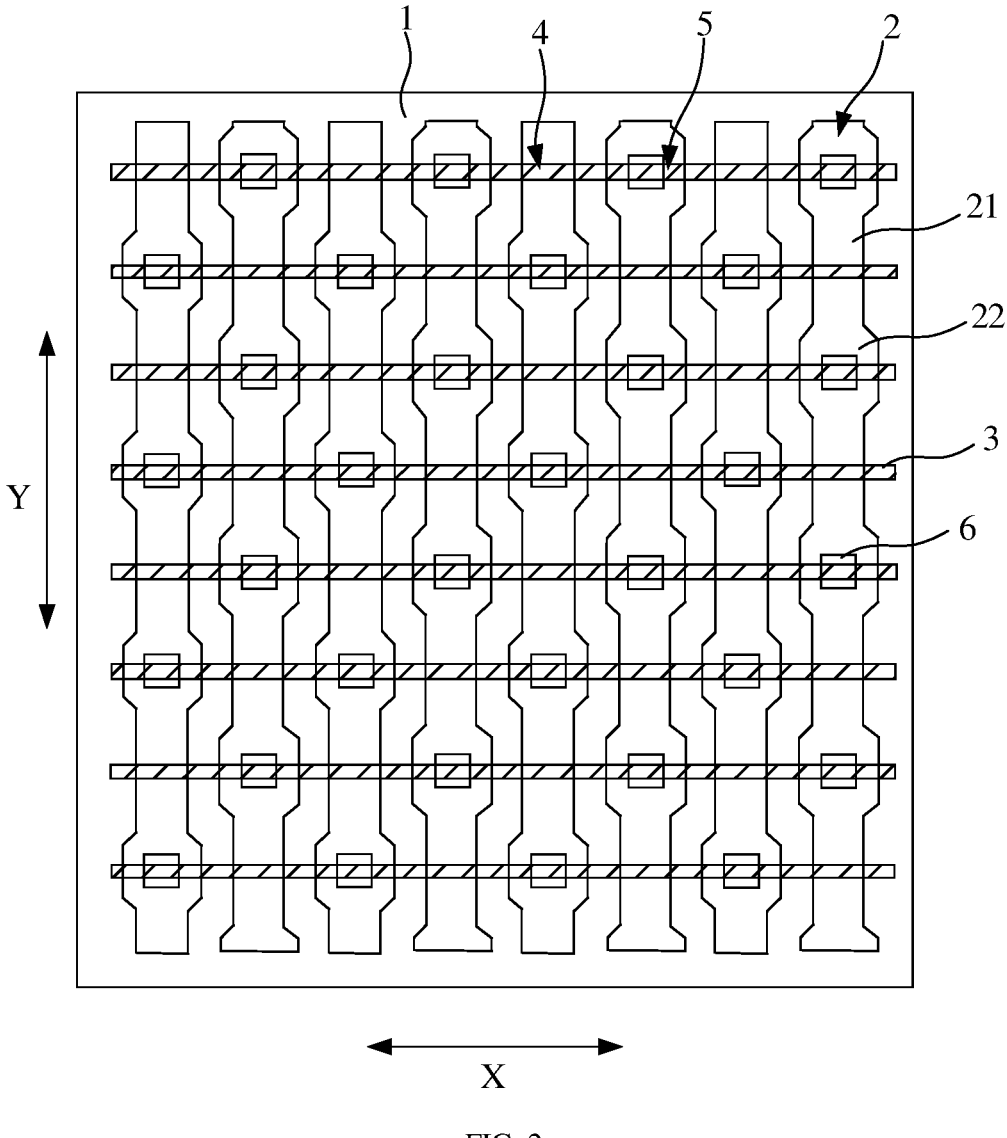
FIG. 2 illustrates a schematic structural diagram of the array substrate in accordance with the second embodiment of the present application.

Referring to FIG. 2, the difference between the array substrate provided in the second embodiment of the present application and the array substrate in the first embodiment is only embodied in the structure of the second sub segment 22. In the second embodiment of the present application, a first hollow hole 6 is disposed on the second sub segment 22, and an orthogonal projection of the first hollow hole 6 on the substrate 1 overlaps with an orthogonal projection of the second signal line 3 on the substrate 1. Due to this arrangement of the second signal line 3 in the second direction Y, when the first signal line 2 bend in the second direction Y, the first signal line 2 will bend at the position where the second signal line 3 overlaps with the first signal line 2. The arrangement of the first hollow hole 6 reduces the size of the second sub segment 22 in the first direction X, that is, the width of the second sub segment 22 is reduced, which is conducive to reducing the risk of fracture of the first signal line 2 when the first signal line 2 is bent in the second direction X.

In this embodiment of the present application, the arrangement of the first hollow hole 6 can reduce the width of the second sub segment 22 at an opening region, uniform stress diffusion is facilitated, the first signal line 2 is not prone to be fractured. However, the width of the second sub segment 22 cannot be too small; otherwise, the current density will be increased and the diffusion speed of coppers in the first signal line 2 and the second signal line 3 will be accelerated. If a crack appears in the insulation layer 11, the coppers in the first signal line 2 and second signal line 3 can be diffused into the crack, thereby causing a short circuit between the first signal line 2 and the second signal line 3, affecting the normal signal transmission. Therefore, the arrangement of the size of the first hollow hole 6 is particularly important.

If the size of the first hollow hole 6 in the first direction X is arranged to be too large, the size of the second sub segment 22 in the first direction X becomes too small in an excavation region. Although this arrangement is conducive to reducing the risk of fracture of the first signal line 2, since the second cross line region 5 of the first signal line 2 and the second signal line 3 is located in the excavation region of the second sub segment 22, the current density of the second sub segment 22 at the second cross line region will increase, the diffusion speed of coppers in the first signal line 2 is accelerated. If the insulation layer 11 is fractured during the bending process of the flexible display panel, the coppers in the first signal line 2 will diffuse into the fracture to cause a short circuit between the first signal line 2 and the second signal line 3, signal transmission is influenced.

If the size of the first hollow hole 6 in the first direction X is arranged to be too small, the size of the second sub segment 22 in the first direction X is almost unchanged at the excavation region. Although the too small size of the first hollow hole 6 does not cause the current density at the second cross line region 5 of the second sub segment 22 to be increased, the second sub segment is prone to be fractured due to the relatively larger size of the second sub segment 22 in the first direction X, as compared to the size of the first sub segment 21.

Thus, in some embodiments, the size of the first hollow hole 6 is less than or equal to half of the size of the second sub segment 22 along the first direction X. This arrangement can prevent the size of the second sub segment 22 from becoming too small in the first direction X, thus, the current density of the first signal line 2 and the second signal line 3 at the cross line overlapping position of the second sub segment 22 would not be too high, and acceleration of diffusion of metal coppers in the first signal line 2 and the second signal line 3 would not occur. When the insulation layer 11 is fractured, the first signal line 2 and the second signal line 3 have a short circuit, which affects the normal signal transmission. Furthermore, the size of the second sub segment 22 in the first direction X decreases at the excavation region, which is conducive to reducing the risk of fracture of the second sub segment 22.

In this embodiment of the present application, the arrangement of the first hollow hole 6 aims at reducing the size of the second sub segment 22 in the first direction X. Thus, the position of the arrangement of the first hollow hole 6 on the second sub segment 22 is not particularly limited. There are several possible arrangements of the first hollow hole 6, which are listed below:

In some embodiments, referring to FIG. 2, an edge of an orthographic projection of the first hollow hole 6 on the substrate 1 is spaced apart from an edge of the orthographic projection of the second sub segment 22 on the substrate 1. That is, the first hollow hole 6 divides the first sub segment 21 into two parts in the first direction X, due to this arrangement, the size of each of the two parts in the first direction X is decreased, the second sub segment 22 is not prone to be fractured when it is bent. Moreover, there are two signal transmission paths in the second direction Y, current density can be effectively reduced and short circuit between the first signal line 2 and the second signal line 3 is avoided.

It should be noted that, the orthographic projection of the first hollow hole 6 on the substrate 1 can be located in the middle of the orthographic projection of the second sub segment 22 on the substrate 1 in the first direction X. Due to this arrangement, the sizes of the two parts of the second sub segment 22 divided by the first hollow hole 6 in the first direction X are equal, such that a more uniform stress distribution on the second sub segment 22 in the same direction is realized, the second sub segment 22 is not prone to be fractured at the first hollow hole 6.

Certainly, in the first direction X, it is also possible that the orthographic projection of the first hollow hole 6 on the substrate 1 is not located in the middle of the orthographic projection of the second sub segment 22 on the substrate 1, which means that the sizes of the two parts of the second sub segment 22 divided by the first hollow hole 6 in the first direction X are not equal. This arrangement can also reduce the size of the second sub segment 22 in the first direction X at the excavation hole, the risk of the fracture of the second sub segment 22 at the first hollow hole 6 is reduced, improvement of the bending performance of flexible display panel is facilitated.

In some embodiments, in the first direction X, an edge of the orthographic projection of the first hollow hole 6 on the substrate 1 coincides with an edge of the orthographic projection of the second sub segment 22 on the substrate 1, which means that, the size of the second sub segment 22 in the first direction X is reduced, however, the signal transmission path of the second sub segment 22 in the second direction Y is still the same. Thus, each second sub segment 22 in the first direction X has the same size, the stress distribution on the second sub segment 22 is more uniform in the same direction, the second sub segment 22 is not prone to be fractured at the first hollow hole 6.

In some embodiments, referring to FIG. 2, the first signal line 2 is in a strip shape; a first hollow hole 6 is arranged on the second sub segment 22. Due to this arrangement, not only the first hollow hole 6 can be punched quickly, the size of the second sub segment 22 in the first direction X can also be reduced.

Referring to FIG. 2, the first hollow hole 6 is a square hole, and an edge of the first hollow hole 6 are arranged to be parallel to the edges of two sides of the second sub segment 22 in the first direction X. Due to this arrangement, the sizes of the parts of the second sub segment 22 are uniform in the first direction X, which is conducive to dispersing stress and preventing the second sub segment 22 from being fractured. In addition to arranging the first hollow hole 6 as the square hole, the first hollow hole 6 can also be arranged to be a circular hole, which is conducive to quickly punching the first hollow hole 6 on the second sub segment 22.

It should be noted that, when the first hollow hole 6 is a square hole, the size of the first hollow hole 6 in the first direction X is the width of the first hollow hole 6, and the size of the first hollow hole 6 in the second direction Y is the length of the first hollow hole 6. When the first hollow hole 6 is a circular hole, the size of the first hollow hole 6 in the first direction X and the size of the first hollow hole 6 in the second direction Y are equal to the diameter of the first hollow hole 6.

Third Embodiment

Figure 3:
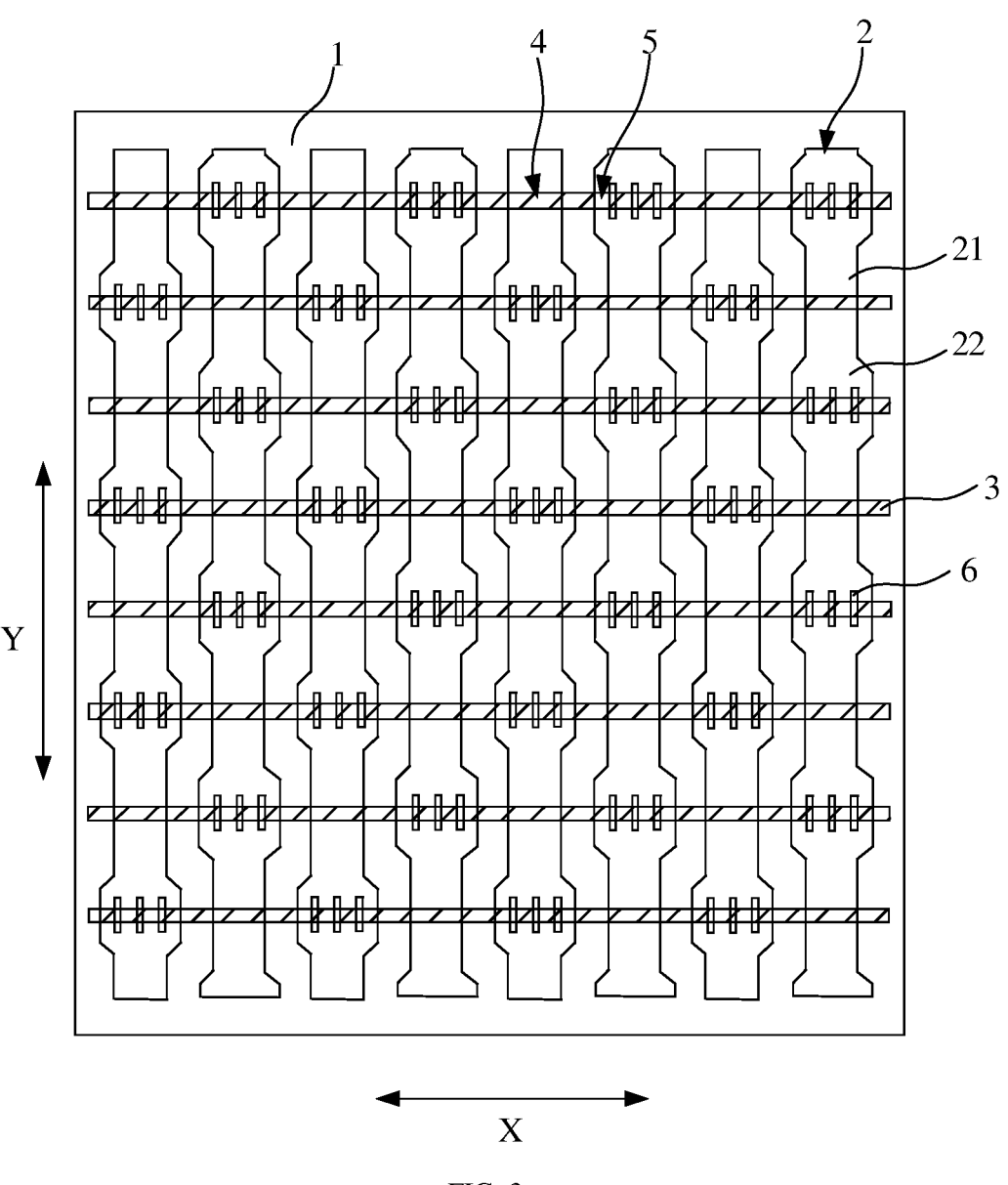
FIG. 3 illustrates a schematic structural diagram of the array substrate in accordance with the third embodiment of the present application.

Referring to FIG. 3, the difference between the array substrate provided in the third embodiment of the present application and the array substrate in the second embodiment is only embodied in the number of first hollow holes 6. In the third embodiment of the present application, a plurality of first hollow holes 6 are arranged on the second sub segment 22, and the plurality of first hollow holes 6 are arranged to be spaced apart from each other in the first direction X. Each of the first hollow holes 6 is a square hole. In this way, the second sub segment 22 is divided into a plurality of parts by the first hollow holes 6, and each of the plurality of parts has a smaller size in the first direction X, which is conducive to stress dispersion, fracture of the second sub segment 22 can be avoided.

It should be noted that, when the plurality of first hollows 6 are arranged on the second sub segment 22, the sum of the sizes of the plurality of first hollows 6 in the first direction X is less than or equal to half of the size of the second sub segment 22 in the first direction X. Due to this arrangement, the second sub segment 22 will not become too thin, and a position at which the current density is too high is not existed. The overall distribution of current densities on the second sub segment 22 is more uniform, and thus short circuit between the first signal line 2 and the second signal line 3 is avoided.

Due to the strip-shaped shape of the second sub segment 22, the first hollow holes 6 arranged on the second sub segment 22 are also in a slender strip shape. Thus, the second sub segment 22 can be divided into a plurality of parts, each of the parts has a smaller size in the first direction X and has a better stress dispersion effect. The second sub segment 22 is not prone to be fractured, and the number of the signal transmission paths on the second sub segment 22 is plural. The normal signal transmission is not influenced even if one path is broken.

Fourth Embodiment

Figure 4:
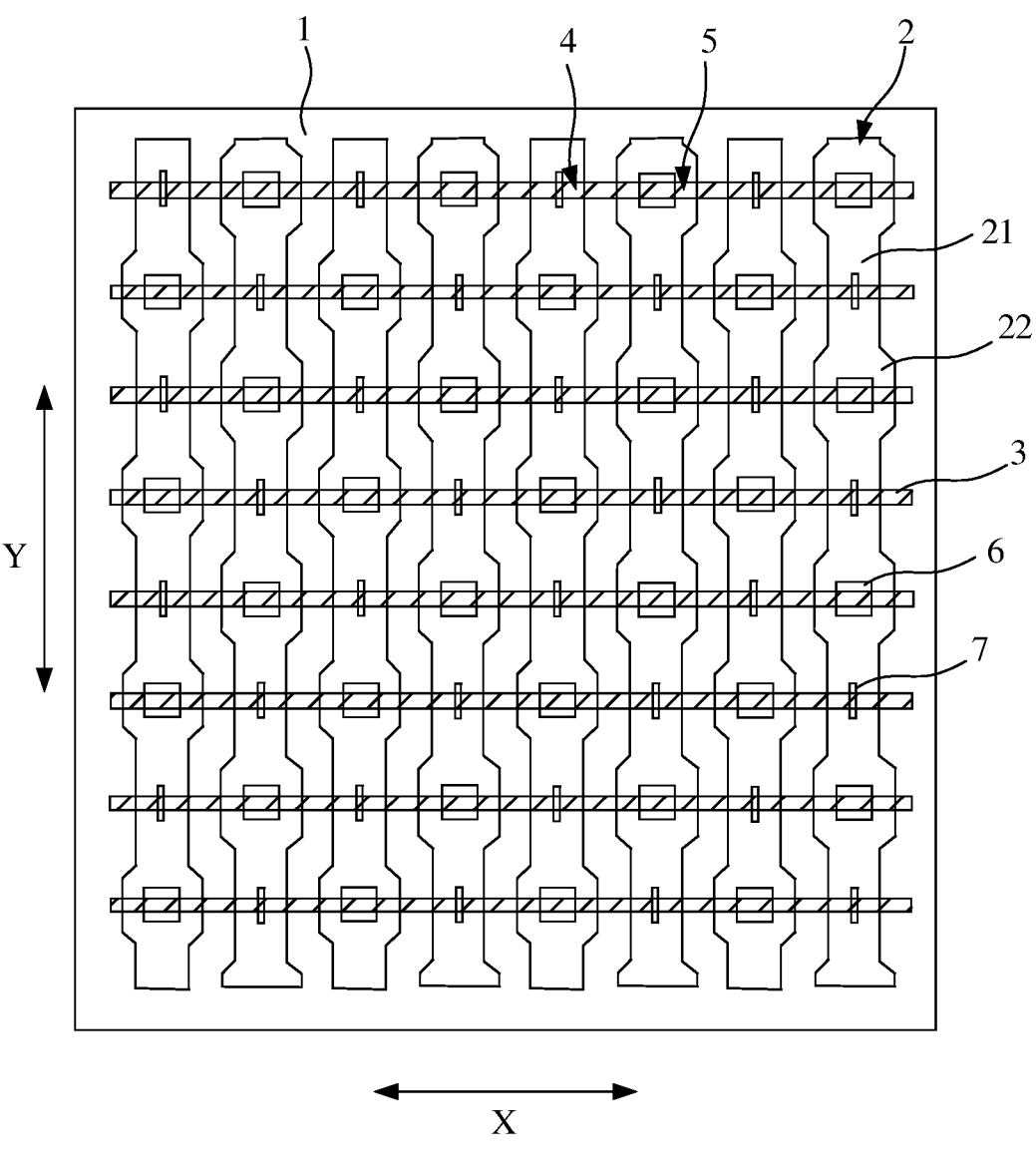
FIG. 4 illustrates a schematic structural diagram of the array substrate in accordance with the fourth embodiment of the present application.

Referring to FIG. 4, the difference between the array substrate provided in the fourth embodiment of the present application and the array substrate in the second embodiment is only embodied in the structure of the first sub segment 21. In the fourth embodiment of the present application, a second hollow hole 7 is arranged on the first sub segment 21, and an orthographic projection of the second hollow hole 7 on the substrate 1 overlaps with an orthographic projection of the second signal line 3 on the substrate 1. Due to this arrangement, the sizes of the first sub segment 21 and the second sub segment 22 in the first direction X are decreased, which is conducive to uniform stress distribution, and the first signal line 2 is not prone to be fractured.

In some embodiments, the size of the second hollow hole 7 is less than or equal to half of the size of the first sub segment 21 along the first direction X.

Since the size of the first sub segment 21 in the first direction X is smaller than the size of the second sub segment 22 in the first direction X, when the second hollow hole 7 is arranged on the first sub segment 21, the first sub segment 21 cannot be arranged to be too thin, the current density is increased accordingly. Thus, in the present application, the size of the second hollow hole 7 in the first direction X is arranged to be less than or equal to half of the size of the first sub segment 21 in the first direction X. Due to this arrangement, too small size of the first sub segment 21 in the first direction X is avoided. Thus, the current density of the first signal line 2 and the second signal line 3 at the cross line overlapping position on the first sub segment 21 will not be too high, accelerated diffusion of metal coppers in the first signal line 2 and the second signal line 3 would not occur. When the insulation layer 11 is fractured, short circuit occurs between the first signal line 2 and the second signal line 3, the normal signal transmission is influenced. Moreover, the size of the first sub segment 21 in the first direction X decreases at the excavation area, which is conducive to reducing the risk of fracture of the first sub segment 21.

It should be noted that, the shape of the second hollow hole 7 can be arranged to be the same as the shape of the first hollow hole 6. Due to this arrangement, the productions of the first hollow hole 6 and the second hollow hole 7 are facilitated.

It should be noted that, when the second hollow hole 7 is a square hole, the size of the second hollow hole 7 in the first direction X is the width of the second hollow hole 7, and the size of the second hollow hole 7 in the second direction Y is the length of the second hollow hole 7. When the second hollow hole 7 is a circular hole, the size of the second hollow hole 7 in the first direction X and the size of the second hollow hole 7 in the second direction Y are equal to the diameter of the second hollow hole 7.

In some embodiments, referring to FIG. 4, the second hollow hole 7 and the first hollow hole 6 on each first signal line 2 are spaced apart from each other. Due to this arrangement, a plurality of signal transmission paths are only formed on the first sub segment 21 and the second sub segment 22 of the first signal line 2, and only one signal transmission path is formed between the first hollow hole 6 and the second hollow hole 7. Once some part of the first sub segment 21 or the second sub segment 22 is fractured, the first signal line 2 can still transmit signals normally without affecting the normal display of the flexible display panel, which is conducive to prolonging the service life of the flexible display panel.

Fifth Embodiment

Referring to FIG. 5, a display panel is provided in the fifth embodiment of the present application. The display panel includes a first substrate 100 and an array substrate 200 as described in any one of the aforesaid embodiments. The array substrate 200 is arranged to be opposite to the first substrate 100. Both the first substrate 100 and the array substrate 200 are flexible substrates.

Regarding the detailed structure of the array substrate 200, reference can be made to the aforesaid embodiments, the detailed structure of the array substrate 200 are not repeatedly described herein. It can be understood that, due to the use of the aforesaid array substrate 200 in the display panel of the present application, the embodiments of the display panel in the present application include all technical solutions of all embodiments of the aforesaid array substrate 200, and can achieve all technical effects that can be achieved by the aforesaid technical solutions.

Sixth Embodiment

Figure 6:
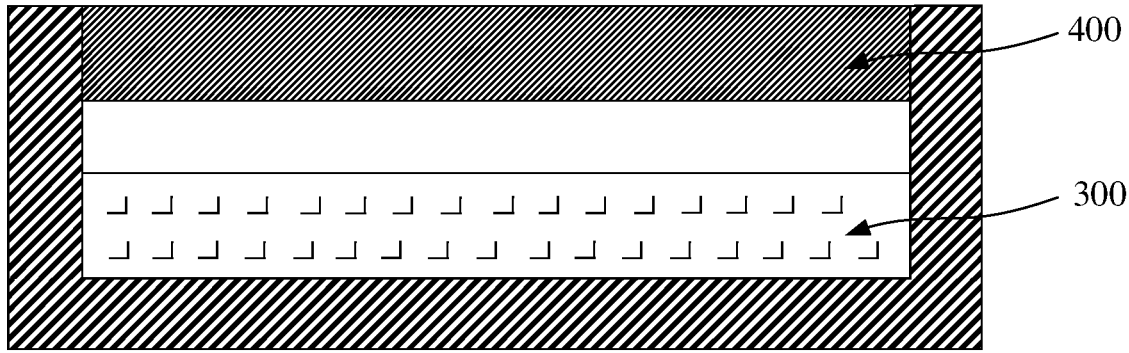
FIG. 6 illustrates a schematic structural diagram of a display device in accordance with the sixth embodiment of the present application.

Referring to FIG. 6, a display device is provided in the sixth embodiment of the present application. The display device includes a drive module 300 and the display panel 400 as described in the aforesaid embodiment. The drive module 300 is electrically connected to the display panel 400.

The foregoing only includes some embodiments of the present application. However, the protection scope of the present application is not limited thereto. The changes or replacements that can be easily conceived by any technical personnel who is familiar with this technical field within the scope of technology disclosed in the present application should all be included within the protection scope of the present application. Thus, the protection scope of the present application should be determined by the protection scopes of the claims.

What is claimed is:

1. An array substrate, comprising: a display region and a peripheral region located around the display region, wherein:

the peripheral region comprises a substrate, a plurality of first signal lines arranged on the substrate, an insulation layer arranged on the substrate and covering the plurality of first signal lines, and a plurality of second signal lines arranged on the insulation layer;

the plurality of first signal lines are arranged in a first direction, the plurality of second signal lines are arranged in a second direction, and the first direction is perpendicular to the second direction;

each first signal line comprises a first sub segment and a second sub segment which are alternately connected along the second direction, and a size of the first sub segment is smaller than a size of the second sub segment in the first direction;

an orthographic projection of the second signal line on the substrate overlaps with an orthographic projection of the first sub segment on the substrate to form a first cross line region, and an orthographic projection of the second signal line on the substrate overlaps with an orthographic projection of the second sub segment on the substrate to form a second cross line region; wherein the first cross line region and the second cross line region are alternately arranged along the first direction;

a size of the first sub segment is the same as that of the second sub segment along the second direction;

a first hollow hole is arranged on the second sub segment, and an orthogonal projection of the first hollow hole on the substrate overlaps with an orthogonal projection of the second signal line on the substrate; and a second hollow hole is arranged on the first sub segment, and an orthogonal projection of the second hollow hole on the substrate overlaps with the orthogonal projection of the second signal line on the substrate.

2. The array substrate according to claim 1, wherein:

the first signal line is in a strip shape; and one first hollow hole is arranged on the second sub segment, and the first hollow hole is a square hole or a circular hole.

3. The array substrate according to claim 1, wherein a size of the second hollow hole is less than or equal to half of the size of the first sub segment along the first direction.

4. The array substrate according to claim 1, wherein; the first cross line region is located in a middle of the first sub segment, and the second cross line region is located in a middle of the second sub segment, along the second direction.

5. The array substrate according to claim 1, wherein:

a plurality of first hollow holes are arranged on the second sub segment, and the plurality of first hollow holes are arranged to be spaced apart along the first direction; and the first hollow holes are square holes.

6. The array substrate according to claim 1, wherein the second hollow hole and the first hollow hole arranged on each of the plurality of first signal lines are spaced apart from each other.

7. The array substrate according to claim 1, wherein a size of the first hollow hole is less than or equal to half of the size of the second sub segment along the first direction.

8. The array substrate according to claim 7, wherein an edge of the orthographic projection of the first hollow hole on the substrate is spaced apart from an edge of the orthographic projection of the second sub segment on the substrate.

9. A display panel, comprising:

a first substrate;

an array substrate arranged to be opposite to the first substrate;

wherein the array substrate comprises a display region and a peripheral region located around the display region;

wherein the peripheral region comprises a substrate, a plurality of first signal lines arranged on the substrate, an insulation layer arranged on the substrate and covering the plurality of first signal lines, and a plurality of second signal lines arranged on the insulation layer;

wherein the plurality of first signal lines are arranged in a first direction, the plurality of second signal lines are arranged in a second direction, and the first direction is perpendicular to the second direction;

wherein, each first signal line comprises a first sub segment and a second sub segment which are alternately arranged along the second direction, and a size of the first sub segment is smaller than that of the second sub segment in the first direction;

wherein an orthographic projection of the second signal line on the substrate overlaps with an orthographic projection of the first sub segment on the substrate to form a first cross line region, and an orthographic projection of the second signal line on the substrate overlaps with an orthographic projection of the second sub segment on the substrate to form a second cross line region;

wherein the first cross line region and the second cross line region are alternately arranged along the first direction;

wherein both the first substrate and the array substrate are flexible substrates;

wherein a size of the first sub segment is a same as that of the second sub segment along the second direction;

wherein a first hollow hole is arranged on the second sub segment, and an orthogonal projection of the first hollow hole on the substrate overlaps with an orthogonal projection of the second signal line on the substrate; and wherein a second hollow hole is arranged on the first sub segment, and an orthogonal projection of the second hollow hole on the substrate overlaps with the orthogonal projection of the second signal line on the substrate.

10. A display device, comprising the display panel according to claim 9 and a drive module electrically connected to the display panel.

11. The display panel according to claim 9, wherein;

the first signal line is in a strip shape; and one first hollow hole is arranged on the second sub segment, and the first hollow hole is a square hole or a circular hole.

12. The display panel according to claim 9, wherein a size of the second hollow hole is less than or equal to half of the size of the first sub segment along the first direction.

13. The display panel according to claim 9, wherein a size of the first hollow hole is less than or equal to half of the size of the second sub segment along the first direction.

14. The display panel according to claim 13, wherein an edge of the orthographic projection of the first hollow hole on the substrate is spaced apart from an edge of the orthographic projection of the second sub segment on the substrate.

\* \* \* \* \*